(12) United States Patent
Tang et al.

(10) Patent No.: US 10,347,861 B2
(45) Date of Patent: Jul. 9, 2019

(54) OLED DISPLAY DEVICE AND MANUFACTURE METHOD THEREOF

(71) Applicant: Wuhan China Star Optoelectronics Technology Co., Ltd., Wuhan (CN)

(72) Inventors: Jinming Tang, Wuhan (CN); Jing Ni, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 350 days.

(21) Appl. No.: 15/505,118

(22) PCT Filed: Dec. 29, 2016

(86) PCT No.: PCT/CN2016/113047
§ 371 (c)(1),
(2) Date: Feb. 20, 2017

(87) PCT Pub. No.: WO2018/113017
PCT Pub. Date: Jun. 28, 2018

(65) Prior Publication Data
US 2019/0109295 A1 Apr. 11, 2019

(30) Foreign Application Priority Data
Dec. 19, 2016 (CN) .......................... 2016 1 1179978

(51) Int. Cl.
*H01L 27/32* (2006.01)
*H01L 51/52* (2006.01)
(Continued)

(52) U.S. Cl.
CPC ...... *H01L 51/5215* (2013.01); *H01L 27/3211* (2013.01); *H01L 27/3246* (2013.01);
(Continued)

(58) Field of Classification Search
CPC ............. H01L 27/3216; H01L 27/3218; H01L 27/3246; H01L 27/3279; H01L 51/001;
(Continued)

(56) References Cited

U.S. PATENT DOCUMENTS

2006/0214573 A1* 9/2006 Maeda ................ H01L 27/3211
313/506
2009/0242911 A1* 10/2009 Ishihara .............. H01L 27/3211
257/89
(Continued)

*Primary Examiner* — Joseph M Galvin, III
(74) *Attorney, Agent, or Firm* — Leong C. Lei

(57) ABSTRACT

Provided are an OLED display device and a manufacture method thereof. By respectively configuring the first transparent semiconductor layer, the second transparent semiconductor layer and the third transparent semiconductor layer in the anode layers of the red OLED element, the green OLED element, the blue OLED element, and setting the same to have various thicknesses to realize that the luminous efficiencies of the red OLED element, the green OLED element, the blue OLED element respectively achieve the best, and the first transparent semiconductor layer, the second transparent semiconductor layer and the third transparent semiconductor layer are deposited and formed by plasma enhanced chemical vapor deposition with three masks. The thicknesses of the hole transporting layers in the red OLED element, the green OLED element, the blue OLED element are the same, thus they can be formed in the same evaporation process with one common metal mask.

13 Claims, 2 Drawing Sheets

(51) Int. Cl.
*H01L 51/50* (2006.01)
*H01L 51/56* (2006.01)
*H01L 51/00* (2006.01)

(52) U.S. Cl.
CPC ........ *H01L 51/001* (2013.01); *H01L 51/0011* (2013.01); *H01L 51/0059* (2013.01); *H01L 51/0072* (2013.01); *H01L 51/0085* (2013.01); *H01L 51/5016* (2013.01); *H01L 51/5036* (2013.01); *H01L 51/5088* (2013.01); *H01L 51/5234* (2013.01); *H01L 51/56* (2013.01); *H01L 51/5056* (2013.01); *H01L 51/5072* (2013.01); *H01L 2227/323* (2013.01); *H01L 2251/306* (2013.01); *H01L 2251/308* (2013.01); *H01L 2251/5315* (2013.01)

(58) Field of Classification Search
CPC ............. H01L 51/0037; H01L 51/0059; H01L 51/0072; H01L 51/0085; H01L 51/5004; H01L 51/5016; H01L 51/504; H01L 51/5212; H01L 51/5218; H01L 51/5228; H01L 51/5265
See application file for complete search history.

(56) References Cited

U.S. PATENT DOCUMENTS

2012/0001207 A1* 1/2012 Lee .................... H01L 51/5203
257/89
2017/0222173 A1* 8/2017 Matsusue ............ H01L 51/5044

\* cited by examiner

US 10,347,861 B2

OLED DISPLAY DEVICE AND MANUFACTURE METHOD THEREOF

FIELD OF THE INVENTION

The present invention relates to a display technology field, and more particularly to an OLED display device and a manufacture method thereof.

BACKGROUND OF THE INVENTION

The Organic Light Emitting Display (OLED) display, which is also named as Organic electroluminescent display, is a new flat panel display device. Because it possesses many outstanding properties of self-illumination, low driving voltage, high luminescence efficiency, short response time, high clarity and contrast, near 180° view angle, wide range of working temperature, applicability of flexible display and large scale full color display. The OLED is considered as the most potential display device in the industry. Because of the excellent performance and the huge market potential, many factories and scientific research institutions in the worldwide have invested in the production and research of the OLED display panel.

The OLED display element generally comprises a substrate, an anode located on the substrate, a Hole Injection Layer located on the anode, a Hole Transporting Layer located on the Hole Injection Layer, an emitting layer located on the Hole Transporting Layer, an Electron Transport Layer located on the emitting layer, an Electron Injection Layer located on the Electron Transport Layer and a Cathode located on the Electron Injection Layer. The principle of the OLED element is that the illumination generates due to the carrier injection and recombination under the electric field driving of the semiconductor material and the organic semiconductor illuminating material. Specifically, with a certain voltage driving, the Electron and the Hole are respectively injected into the Electron and Hole Transporting Layers from the cathode and the anode. The Electron and the Hole respectively migrate from the Electron and Hole Transporting Layers to the Emitting layer and bump into each other in the Emitting layer to form an exciton to excite the emitting molecule. The latter can illuminate after the radiative relaxation.

For manufacturing the OLED display panel with narrow-line emission, people change the structure of the OLED display panel, and manufacture the Fabry-Perot optical micro cavity of the OLED display panel to acquire the high brightness narrow-line emission. The optical micro cavity does not only realize the narrow-line emission but also significantly enhance the intensity of emission relative to the element of micro cavity structure. The conventional Fabry-Perot optical microcavity requires two reflective mirrors, which generally uses the metal-metal structure. Thus, the microcavity total light path of the Fabry-Perot optical microcavity is restricted by the thickness and refractive index of organic film layer in the OLED display panel.

Specifically, in the full color display OLED display device for making the red OLED elements, the green OLED elements, the blue OLED elements respectively achieve the optimized luminous efficiencies, the hole transporting layers of the OLED elements of different colors are set to have different thicknesses to adjust the light paths of the red light, the green light, the blue light. The Fabry-Perot resonance principle is used to calculate the best light paths to make the red light emitting layers, green light emitting layers, blue light emitting layers respectively at the positions of the second antinodes, and thus, the luminous efficiencies reach the maximum. It requires that the hole transporting layers of the red OLED elements, the green OLED elements, the blue OLED elements need to use three different FMMs (Fine Metal Mask) to be manufactured with three evaporation processes. Accordingly, the production cost is increased, and the process time is extended. Meanwhile, the product yield decreases due to the complexity of the process.

SUMMARY OF THE INVENTION

An objective of the present invention is to provide an OLED display device, which can realize that the luminous efficiencies of the red OLED element, the green OLED element, the blue OLED element respectively achieve the best, and the process is mature to lower the cost and to raise the product yield.

Another objective of the present invention is to provide a manufacture method of an OLED display device, which can realize that the luminous efficiencies of the red OLED element, the green OLED element, the blue OLED element respectively achieve the best, and the process is mature to lower the cost and to raise the product yield.

For realizing the aforesaid objectives, the present invention provides an OLED display device, comprising a substrate, and a plurality of red OLED elements, a plurality of green OLED elements and a plurality of blue OLED elements aligned on the substrate in array;

either of the red OLED element, the green OLED element and the blue OLED element comprising a first transparent conductive metal oxide layer, a metal layer, transparent semiconductor layers, a second transparent conductive metal oxide layer, a hole injection layer, a hole transporting layer, light emitting layers, an electron transporting layer and a cathode layer on the substrate from bottom to top in order;

the transparent semiconductor layers of the red OLED element, the green OLED element and the blue OLED element respectively being a first transparent semiconductor layer, a second transparent semiconductor layer and a third transparent semiconductor layer;

the light emitting layers of the red OLED element, the green OLED element and the blue OLED element respectively being a red light emitting layer, a green light emitting layer and a blue light emitting layer;

wherein materials of the first transparent semiconductor layer, the second transparent semiconductor layer and the third transparent semiconductor layer are the same, and a refractive index thereof is $\eta_P$; a refractive index of the second transparent conductive metal oxide layer is $\eta_I$; a refractive index of the hole injection layer is $\eta_J$; a refractive index of the hole transporting layer is $\eta_T$; a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$; thicknesses of the first transparent semiconductor layer, the second transparent semiconductor layer and the third transparent semiconductor layer respectively are defined to be $d_{RP}$, $d_{GP}$ and $d_{BP}$, and a thickness of the second transparent conductive metal oxide layer is defined to be $d_I$, and a thickness of the hole injection layer is defined to be $d_J$, and a thickness of the hole transporting layer is defined to be $d_T$; then a relation of $d_{RP}$, $d_I$, $d_J$, $d_T$ satisfies a relationship (1):

$$\eta_P \times d_{RP} + \eta_I \times d_I + \eta_J \times d_J + \eta_T \times d_T = (2m_R+1)\lambda_R/4 \quad (1);$$

wherein $m_R$ is a natural number;
a relation of $d_{GP}$, $d_I$, $d_J$, $d_T$ satisfies a relationship (2):

$$\eta_P \times d_{GP} + \eta_I \times d_I + \eta_J \times d_J + \eta_T \times d_T = (2m_G+1)\lambda_G/4 \quad (2);$$

wherein $m_G$ is a natural number;

a relation of $d_{BP}$, $d_I$, $d_J$, $d_T$ satisfies a relationship (3):

$$\eta_P \times d_{BP} + \eta_I \times d_I + \eta_J \times d_J + \eta_T \times d_T = (2m_B+1)\lambda_B/4 \quad (3);$$

wherein $m_B$ is a natural number.

All materials of the first transparent semiconductor layer, the second transparent semiconductor layer and the third transparent semiconductor layer are $SiO_2$, $TiO_2$, MgO, ZnO, $Al_2O_3$, $SnO_2$, $InO_2$, $ZrO_2$, $SiN_x$, $Si_3N_4$, $MgF_2$, $CaF_2$, ZnSe or ZnS, wherein X>1;

light transmittances of the first transparent semiconductor layer, the second transparent semiconductor layer and the third transparent semiconductor layer are larger than 80%; all refractive indexes of the first transparent semiconductor layer, the second transparent semiconductor layer and the third transparent semiconductor layer are between 1.0-3.5.

A material of the first transparent conductive metal oxide layer and the second transparent conductive metal oxide layer is indium tin oxide; a material of the metal layer is silver.

All the red light emitting layer, the green light emitting layer and the blue light emitting layer comprise a main material and a doped dye;

the main material of the red light emitting layer is CBP, and the doped dye is red phosphorescent dye, and the red phosphorescent dye is $Ir(DBQ)_2(acac)$;

the main material of the green light emitting layer is CBP, and the doped dye is green phosphorescent dye, and the green phosphorescent dye is $Ir(ppy)_3$;

the main material of the blue light emitting layer is AND, and the doped dye is blue fluorescent dye, and the blue fluorescent dye is BUBD-1;

a material of the hole injection layer comprises $HAT(CN)_6$;

a material of the electron transporting layer comprises BPhen.

A material of the cathode layer comprises at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium.

The present invention further provides a manufacture method of an OLED display device, comprising steps of:

step 1, providing a substrate, and the substrate comprises a plurality of red pixel regions, a plurality of green pixel regions and a plurality of blue pixel regions aligned in array;

depositing and forming a first transparent conductive metal oxide layer and a metal layer from bottom to top in order on the substrate corresponding to all the red pixel region, the green pixel region and the blue pixel region;

employing plasma enhanced chemical vapor deposition and using three masks to respectively deposit and form transparent semiconductor layers on the metal layer corresponding to the red pixel region, the green pixel region and the blue pixel region, and the transparent semiconductor layers corresponding to the red pixel region, the green pixel region and the blue pixel region respectively being a first transparent semiconductor layer, a second transparent semiconductor layer and a third transparent semiconductor layer;

forming a second transparent conductive metal oxide layer on the transparent semiconductor layer corresponding to the red pixel region, the green pixel region and the blue pixel region;

step 2, depositing and forming a hole injection layer and a hole transporting layer from bottom to top in order on the second transparent conductive metal oxide layer corresponding to the red pixel region, the green pixel region and the blue pixel region;

respectively depositing and forming light emitting layers on the hole transporting layer corresponding to the red pixel region, the green pixel region and the blue pixel region, and the light emitting layers corresponding to the red pixel region, the green pixel region and the blue pixel region respectively being a red light emitting layer, a green light emitting layer and a blue light emitting layer;

forming an electron transporting layer on the light emitting layers corresponding to the red pixel region, the green pixel region and the blue pixel region;

step 3, depositing and forming a cathode layer on the electron transporting layer corresponding to the red pixel region, the green pixel region and the blue pixel region to obtain a red OLED element, a green OLED element and a blue OLED element respectively corresponding to the red pixel region, the green pixel region and the blue pixel region;

wherein materials of the first transparent semiconductor layer, the second transparent semiconductor layer and the third transparent semiconductor layer are the same, and a refractive index thereof is $\eta_P$; a refractive index of the second transparent conductive metal oxide layer is $\eta_I$; a refractive index of the hole injection layer is $\eta_J$; a refractive index of the hole transporting layer is $\eta_T$; a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$; thicknesses of the first transparent semiconductor layer, the second transparent semiconductor layer and the third transparent semiconductor layer respectively are defined to be $d_{RP}$, $d_{GP}$ and $d_{BP}$, and a thickness of the second transparent conductive metal oxide layer is defined to be $d_I$, and a thickness of the hole injection layer is defined to be $d_J$, and a thickness of the hole transporting layer is defined to be $d_T$; then a relation of $d_{RP}$, $d_I$, $d_J$, $d_T$ satisfies a relationship (1):

$$\eta_P \times d_{RP} + \eta_I \times d_I + \eta_J \times d_J + \eta_T \times d_T = (2m_R+1)\lambda_R/4 \quad (1);$$

wherein $m_R$ is a natural number;
a relation of $d_{GP}$, $d_I$, $d_J$, $d_T$ satisfies a relationship (2):

$$\eta_P \times d_{GP} + \eta_I \times d_I + \eta_J \times d_J + \eta_T \times d_T = (2m_G+1)\lambda_G/4 \quad (2);$$

wherein $m_G$ is a natural number;
a relation of $d_{BP}$, $d_I$, $d_J$, $d_T$ satisfies a relationship (3):

$$\eta_P \times d_{BP} + \eta_I \times d_I + \eta_J \times d_J + \eta_T \times d_T = (2m_B+1)\lambda_B/4 \quad (3);$$

wherein $m_B$ is a natural number.

All materials of the first transparent semiconductor layer, the second transparent semiconductor layer and the third transparent semiconductor layer are $SiO_2$, $TiO_2$, MgO, ZnO, $Al_2O_3$, $SnO_2$, $InO_2$, $ZrO_2$, $SiN_x$, $Si_3N_4$, $MgF_2$, $CaF_2$, ZnSe or ZnS, wherein X>1;

light transmittances of the first transparent semiconductor layer, the second transparent semiconductor layer and the third transparent semiconductor layer are larger than 80%; all refractive indexes of the first transparent semiconductor layer, the second transparent semiconductor layer and the third transparent semiconductor layer are between 1.0-3.5.

A material of the first transparent conductive metal oxide layer and the second transparent conductive metal oxide layer is indium tin oxide; a material of the metal layer is silver;

in step 1, a magnetron sputtering method is used to deposit and form the first transparent conductive metal oxide layer, the second transparent conductive metal oxide layer and the metal layer.

All the red light emitting layer, the green light emitting layer and the blue light emitting layer comprise a main material and a doped dye;

the main material of the red light emitting layer is CBP, and the doped dye is red phosphorescent dye, and the red phosphorescent dye is Ir(DBQ)$_2$(acac);

the main material of the green light emitting layer is CBP, and the doped dye is green phosphorescent dye, and the green phosphorescent dye is Ir(ppy)$_3$;

the main material of the blue light emitting layer is AND, and the doped dye is blue fluorescent dye, and the blue fluorescent dye is BUBD-1;

a material of the hole injection layer comprises HAT(CN)$_6$;

a material of the electron transporting layer comprises BPhen;

in step 2, a vacuum evaporation method is used to deposit and form the hole injection layer, the hole transporting layer and the electron transporting layer.

A material of the cathode layer comprises at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium;

in step 3, a vacuum evaporation method is used to deposit and form the cathode layer.

The present invention further provides an OLED display device, comprising a substrate, and a plurality of red OLED elements, a plurality of green OLED elements and a plurality of blue OLED elements aligned on the substrate in array;

either of the red OLED element, the green OLED element and the blue OLED element comprising a first transparent conductive metal oxide layer, a metal layer, transparent semiconductor layers, a second transparent conductive metal oxide layer, a hole injection layer, a hole transporting layer, light emitting layers, an electron transporting layer and a cathode layer on the substrate from bottom to top in order;

the transparent semiconductor layers of the red OLED element, the green OLED element and the blue OLED element respectively being a first transparent semiconductor layer, a second transparent semiconductor layer and a third transparent semiconductor layer;

the light emitting layers of the red OLED element, the green OLED element and the blue OLED element respectively being a red light emitting layer, a green light emitting layer and a blue light emitting layer;

wherein materials of the first transparent semiconductor layer, the second transparent semiconductor layer and the third transparent semiconductor layer are the same, and a refractive index thereof is $\eta_P$; a refractive index of the second transparent conductive metal oxide layer is $\eta_I$; a refractive index of the hole injection layer is $\eta_J$; a refractive index of the hole transporting layer is $\eta_T$; a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$; thicknesses of the first transparent semiconductor layer, the second transparent semiconductor layer and the third transparent semiconductor layer respectively are defined to be $d_{RP}$, $d_{GP}$ and $d_{BP}$, and a thickness of the second transparent conductive metal oxide layer is defined to be $d_I$, and a thickness of the hole injection layer is defined to be $d_J$, and a thickness of the hole transporting layer is defined to be $d_T$; then a relation of $d_{RP}$, $d_I$, $d_J$, $d_T$ satisfies a relationship:

$\eta_P \times d_{RP} + \eta_I \times d_I + \eta_J \times d_J + \eta_T \times d_T = (2m_R+1)\lambda_R/4$;

wherein $m_R$ is a natural number;

a relation of $d_{GP}$, $d_I$, $d_J$, $d_T$ satisfies a relationship:

$\eta_P \times d_{GP} + \eta_I \times d_I + \eta_J \times d_J + \eta_T \times d_T = (2m_B+1)\lambda_B/4$;

wherein $m_G$ is a natural number;

a relation of $d_{BP}$, $d_I$, $d_J$, $d_T$ satisfies a relationship:

$\eta_P \times d_{BP} + \eta_I \times d_I + \eta_J \times d_J + \eta_T \times d_T = (2m_B+1)\lambda_B/4$;

wherein $m_B$ is a natural number;

wherein all materials of the first transparent semiconductor layer, the second transparent semiconductor layer and the third transparent semiconductor layer are SiO$_2$, TiO$_2$, MgO, ZnO, Al$_2$O$_3$, SnO$_2$, InO$_2$, ZrO$_2$, SiN$_x$, Si$_3$N$_4$, MgF$_2$, CaF$_2$, ZnSe or ZnS, wherein X>1;

light transmittances of the first transparent semiconductor layer, the second transparent semiconductor layer and the third transparent semiconductor layer are larger than 80%; all refractive indexes of the first transparent semiconductor layer, the second transparent semiconductor layer and the third transparent semiconductor layer are between 1.0-3.5;

wherein a material of the first transparent conductive metal oxide layer and the second transparent conductive metal oxide layer is indium tin oxide; a material of the metal layer is silver.

The benefits of the present invention are: the present invention provides an OLED display device and a manufacture method thereof. By respectively configuring the first transparent semiconductor layer, the second transparent semiconductor layer and the third transparent semiconductor layer in the anode layers of the red OLED element, the green OLED element, the blue OLED element, and setting the first transparent semiconductor layer, the second transparent semiconductor layer and the third transparent semiconductor layer to have various thicknesses to realize that the luminous efficiencies of the red OLED element, the green OLED element, the blue OLED element respectively achieve the best, and all the first transparent semiconductor layer, the second transparent semiconductor layer and the third transparent semiconductor layer are deposited and formed by plasma enhanced chemical vapor deposition and three masks. In comparison with the traditional OLED display device, the thicknesses of the hole transporting layers in the red OLED element, the green OLED element, the blue OLED element are respectively set to be the same in the present invention, thus they can be formed in the same evaporation process with one common metal mask to save the three fine metal masks (FMM) in the organic function layer process. Although the process of the anode layer is relatively more complicated than prior art, the skill utilizing the FMM to deposit the inorganic film is relatively more mature than the skill of depositing the organic film and has the higher yield. Therefore, in sum, the technical solution of the present invention still has the obvious process advantage, and promotes the product yield while saving the cost.

In order to better understand the characteristics and technical aspect of the invention, please refer to the following detailed description of the present invention is concerned with the diagrams, however, provide reference to the accompanying drawings and description only and is not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
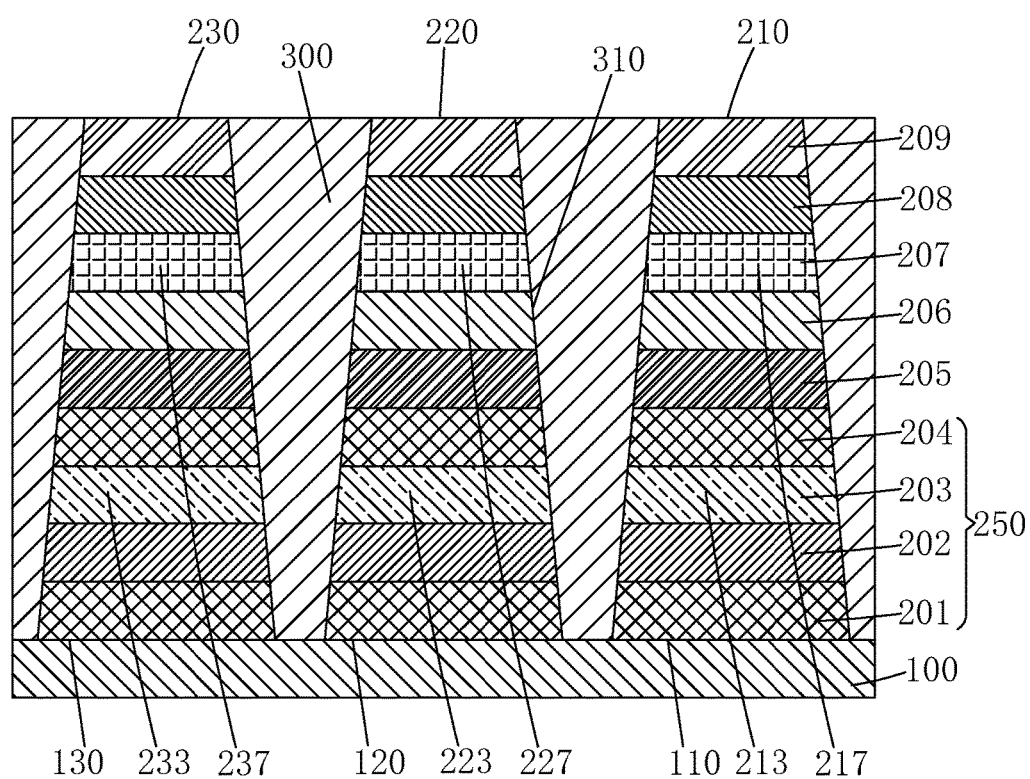
FIG. 1 is a structure diagram of an OLED display device of the present invention.

Please refer to FIG. 1. The present invention provides an OLED display device, comprising a substrate 100, and a plurality of red OLED elements 210, a plurality of green OLED elements 220 and a plurality of blue OLED elements 230 aligned on the substrate 100 in array;

either of the red OLED element 210, the green OLED element 220 and the blue OLED element 230 comprising a first transparent conductive metal oxide layer 201, a metal layer 202, transparent semiconductor layers 203, a second transparent conductive metal oxide layer 204, a hole injection layer 205, a hole transporting layer 206, light emitting layers 207, an electron transporting layer 208 and a cathode layer 209 on the substrate 100 from bottom to top in order;

in each of the red OLED element 210, the green OLED element 220 and the blue OLED element 230, the first transparent conductive metal oxide layer 201, the metal layer 202, the transparent semiconductor layers 203 and the second transparent conductive metal oxide 204 which are stacked up from bottom to top in order constituting an anode layer 250, together;

the transparent semiconductor layers 203 of the red OLED element 210, the green OLED element 220 and the blue OLED element 230 respectively being a first transparent semiconductor layer 213, a second transparent semiconductor layer 223 and a third transparent semiconductor layer 233;

the light emitting layers 207 of the red OLED element 210, the green OLED element 220 and the blue OLED element 230 respectively being a red light emitting layer 217, a green light emitting layer 227 and a blue light emitting layer 237;

wherein materials of the first transparent semiconductor layer 213, the second transparent semiconductor layer 223 and the third transparent semiconductor layer 233 are the same, and a refractive index thereof is $\eta_P$; a refractive index of the second transparent conductive metal oxide layer 204 is $\eta_I$; a refractive index of the hole injection layer 205 is $\eta_J$; a refractive index of the hole transporting layer 206 is $\eta_T$; a peak wavelength of red light emitted by the red light emitting layer 217 is $\lambda_R$, and a peak wavelength of green light emitted by the green light emitting layer 227 is $\lambda_G$, and a peak wavelength of blue light emitted by the blue light emitting layer 237 is $\lambda_B$; thicknesses of the first transparent semiconductor layer 213, the second transparent semiconductor layer 223 and the third transparent semiconductor layer 233 respectively are defined to be $d_{RP}$, $d_{GP}$ and $d_{BP}$, and a thickness of the second transparent conductive metal oxide layer 204 is defined to be $d_I$, and a thickness of the hole injection layer 205 is defined to be $d_J$, and a thickness of the hole transporting layer 206 is defined to be $d_T$; then a relation of $d_{RP}$, $d_I$, $d_J$, $d_T$ satisfies a relationship (1):

$$\eta_P \times d_{RP} + \eta_I \times d_I + \eta_J \times d_J + \eta_T \times d_T = (2m_R+1)\lambda_R/4 \quad (1);$$

wherein $m_R$ is a natural number;
a relation of $d_{GP}$, $d_I$, $d_J$, $d_T$ satisfies a relationship (2):

$$\eta_P \times d_{GP} + \eta_I \times d_I + \eta_J \times d_J + \eta_T \times d_T = (2m_G+1)\lambda_G/4 \quad (2);$$

wherein $m_G$ is a natural number;
a relation of $d_{BP}$, $d_I$, $d_J$, $d_T$ satisfies a relationship (3):

$$\eta_P \times d_{BP} + \eta_I \times d_I + \eta_J \times d_J + \eta_T \times d_T = (2m_B+1)\lambda_B/4 \quad (3);$$

wherein $m_B$ is a natural number.

Under the normal condition, $m_R = m_G = m_B$, and $\lambda_R$, $\lambda_G$, $\lambda_B$ are unequal, and thus, $d_{RP}$, $d_{GP}$, $d_{BP}$ are unequal. Namely, the present invention adjusts the thicknesses of the first transparent semiconductor layer 213, the second transparent semiconductor layer 223 and the third transparent semiconductor layer 233 in the red OLED element 210, the green OLED element 220, the blue OLED element 230 to realize that the luminous efficiencies of the red OLED element 210, the green OLED element 220, the blue OLED element 230 respectively achieve the best, and all the first transparent semiconductor layer 213, the second transparent semiconductor layer 223 and the third transparent semiconductor layer 233 can be deposited and formed by the PECVD (Plasma Enhanced Chemical Vapor Deposition) method with three masks. In comparison with the traditional OLED display device, the thicknesses of the hole transporting layers 206 in the red OLED element 210, the green OLED element 220, the blue OLED element 230 are the same in the OLED display device of the present invention, thus the hole transporting layers 206 in the red OLED element 210, the green OLED element 220, the blue OLED element 230 can be formed in the same evaporation process with one CMM (Common Metal Mask) to eliminate three fine metal masks (FMM) in the process of the organic function layer. Although the process of the anode layer 250 is relatively more complicated than prior art, the skill utilizing the FMM to deposit the inorganic film is relatively more mature than the skill of depositing the organic film and has the higher yield. Therefore, in sum, the technical solution of the present invention still has the obvious process advantage.

Specifically, in the OLED display device of the present invention, the anode layer 250 in each of the red OLED element 210, the green OLED element 220 and the blue OLED element 230 is a reflective electrode, and the cathode layer 209 is a semi transparent electrode, and thus all the red OLED element 210, the green OLED element 220 and the blue OLED element 230 are top emitting OLED elements. The OLED display device of the present invention is a top emitting OLED display device.

Specifically, the reasoning process of the foregoing relationships (1), (2), (3) is:

According to the Fabry-Perot resonance principle, for making the luminous efficiency of the top emitting OLED element achieve the best, the distance d from the light emitting layer to the reflection anode in the top emitting OLED element needs to satisfy the following relationship (4):

$$[\{(2m+1)/4\}-(\tfrac{1}{8})]\lambda < \eta d < [\{(2m+1)/4\}+(\tfrac{1}{8})]\lambda \quad (4);$$

wherein d represents the distance from the light emitting layer to the reflection anode, and $\eta$ represents the refractive index of the material between the light emitting layer and the reflection anode, and λ represents the peak wavelength of the light emitted by the light emitting layer, and m represents the natural number.

Furthermore, preferably, the distance d satisfies the following relationship (5):

[{(2m+1)/4}−(1/16)]λ<ηd<[{(2m+1)/4}+(1/16)]λ  (5);

Accordingly, it can be derived that as being the best preferred, the distance d=(2m+1)λ/(4η).

Specifically, in the red/green/blue OLED elements 210/220/230 of the present invention, the distance d from the light emitting layer to the reflection anode is equal to a sum of thicknesses of the transparent semiconductor layer 203, the second transparent conductive metal oxide layer 204, the hole injection layer 205 and the hole transporting layer 206 on the metal layer 202.

Specifically, in the red OLED element 210, the distance from the red light emitting layer 217 to the anode layer 250 $d_R=d_{RP}+d_{RI}+d_{RJ}+d_{RT}$, and thus, $\eta \times d_R\eta_P \times d_{RP}+\eta_I \times d_I+\eta_J \times d_J+\eta_T \times dT=(2_{mR}+1)\lambda_R/4$.

Specifically, in the green OLED element 220, the distance from the green light emitting layer 227 to the anode layer 250 $d_G=d_{BP}+d_{BI}+d_{BJ}+d_{BT}$, and thus, $\eta \times d_G=\eta_P \times d_{GP}+\eta_I \times d_I+\eta_J \times d_J+\eta_T \times d_T=(2_{mG}+1)\lambda_G/4$.

Specifically, in the blue OLED element 230, the distance from the blue light emitting layer 237 to the anode layer 250 $d_B=d_{BP}+d_{BI}+d_{BJ}+d_{BT}$, and thus, $n \times d_B=\eta_P \times d_{BP}+\eta_I \times d_I+\eta_J \times d_J+\eta_T \times d_T=(2_{mB}+1)\lambda_B/4$.

Specifically, the substrate 100 is a transparent rigid substrate or a transparent flexible substrate. The transparent rigid substrate can be a glass substrate. The material of the flexible substrate comprises at least one of polyester compound and polyimide compound. In the embodiment of the present invention, the substrate 100 is a glass substrate.

Specifically, the OLED display device of the present invention further comprises a pixel definition layer 300 located on the substrate 100, and the pixel definition layer 300 comprises a plurality of through holes 311, and the red OLED elements 210, the green OLED elements 220 and the blue OLED elements 230 respectively located in the plurality of through holes 310.

Specifically, the plurality of through holes 310 in the pixel definition layer 300 appear to be tapered, and a dimension of the through hole 310 gradually increases from one end away from the substrate 100 to one end close to the substrate 100.

Specifically, material of the pixel definition layer 300 is an organic insulation material, and preferably is polyimide (PI).

Preferably, materials of the first transparent conductive metal oxide layer 201 and the second transparent conductive metal oxide layer 204 are tin indium oxide, and a material of the metal layer 203 is silver.

Specifically, a material of the first transparent semiconductor layer 213, the second transparent semiconductor layer 223 and the third transparent semiconductor layer 233 is selected from oxides, sulfides, selenides, nitrides, and fluorides, which mainly are silica ($SiO_2$), titanium dioxide ($TiO_2$), magnesium oxide (MgO), zinc oxide (ZnO), alumina ($Al_2O_3$), stannic oxide ($SnO_2$), indium oxide ($InO_2$), zirconium oxide ($ZrO_2$), silicon nitride ($SiN_x$) (X>1), silicon nitride ($Si_3N_4$), magnesium fluoride ($MgF_2$), calcium fluoride ($CaF_2$), zinc selenide (ZnSe) or zinc sulfide (ZnS).

Specifically, light transmittances of the first transparent semiconductor layer 213, the second transparent semiconductor layer 223 and the third transparent semiconductor layer 233 are larger than 80%, and preferably are larger than 85%, and more preferably are larger than 90%.

Specifically, refractive indexes of the first transparent semiconductor layer 213, the second transparent semiconductor layer 223 and the third transparent semiconductor layer 233 are between 1.0-3.5, and preferably are between 1.4-2.5, and preferably, a material of the first transparent semiconductor layer 213, the second transparent semiconductor layer 223 and the third transparent semiconductor layer 233 is $SiO_2$, $TiO_2$, $SiN_x$ (X>1), $Si_3N_4$, $MgF_2$, $CaF_2$, ZnSe; wherein a refractive index of $TiO_2$ is n=2.2-2.5, and a refractive index of $SiO_2$ is n=1.9-2.0, and a refractive index of ZnSe is n=2.4-2.5, and a refractive index of $MgF_2$ is n=1.39; a refractive index of $CaF_2$ is n=1.44, and a refractive index of ZnS is n=2.38; a refractive index of $ZrO_2$ is n=1.93.

Specifically, a material of the cathode layer 209 comprises at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium.

Preferably, the cathode layer 209 is a magnesium silver alloy layer, a composite layer composed of stacking up magnesium silver alloy layers and silver layers, a composite layer composed of stacking up a lithium fluoride layer or a lithium nitride layer and a silver layer, or a composite layer composed of stacking up a lithium fluoride layer or a lithium nitride layer and an aluminum layer. In the embodiment of the present invention, the cathode 209 is a magnesium silver alloy layer.

Specifically, a material of the hole injection layer 205 comprises $HAT(CN)_6$, and a constitutional formula of $HAT(CN)_6$ is

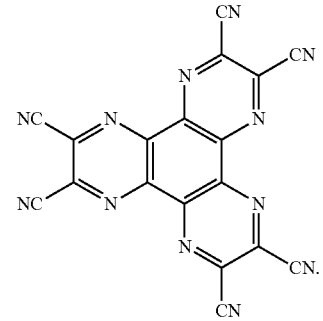 [SMILES: N#Cc1nc2c3nc(C#N)c(C#N)nc3c3nc(C#N)c(C#N)nc3c2nc1C#N]

Specifically, a material of the hole transporting layer 206 comprises HTM081 of the merck company.

Specifically, the red light emitting layer 217, the green light emitting layer 227 and the blue light emitting layer 237 comprise a main material and a doped dye.

Specifically, the main material of the red light emitting layer 217 is CBP, and the doped dye is red phosphorescent dye, and preferably, the red phosphorescent dye is $Ir(DBQ)_2(acac)$. Specifically, in the red light emitting layer 217, a concentration of the doped dye is 3 wt %-5 wt %.

Specifically, the main material of the green light emitting layer 227 is CBP, and the doped dye is green phosphorescent dye, and preferably, the green phosphorescent dye is $Ir(ppy)_3$. Specifically, in the green light emitting layer 227, a concentration of the doped dye is 3 wt %-15 wt %, and preferably is 3 wt %-10 wt %, and more preferably is 5 wt %-10 wt %.

Specifically, the main material of the blue light emitting layer 237 is AND, and the doped dye is blue fluorescent dye, and preferably, the blue fluorescent dye is BUBD-1. Specifically, in the blue light emitting layer 237, a concentration of the doped dye is 3 wt %-5 wt %.

Specifically, a constitutional formula of CBP is

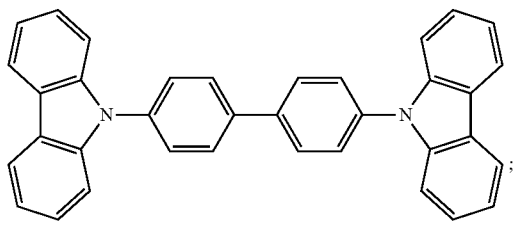 [SMILES: c1ccc2c(c1)c1ccccc1n2-c1ccc(-c2ccc(-n3c4ccccc4c4ccccc43)cc2)cc1]

a constitutional formula of Ir(DBQ)$_2$(acac) is

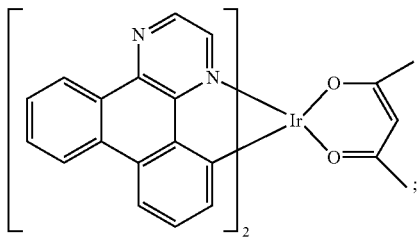

a constitutional formula of Ir(ppy)$_3$ is

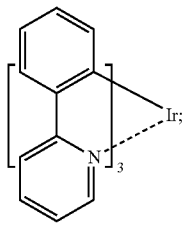

a constitutional formula of BUBD-1 is

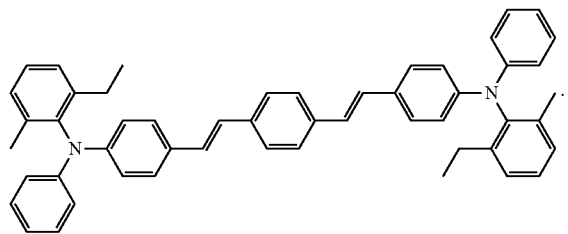 [SMILES: CCc1cccc(C)c1N(c1ccccc1)c1ccc(/C=C/c2ccc(/C=C/c3ccc(N(c4ccccc4)c4c(C)cccc4CC)cc3)cc2)cc1]

Specifically, a peak wavelength $\lambda_R$ of red light emitted by the red light emitting layer 217 is 612 nm, and a peak wavelength AG of green light emitted by the green light emitting layer 227 is 512 nm, and a peak wavelength $\lambda_B$ of blue light emitted by the blue light emitting layer 237 is 468 nm.

Specifically, a material of the electron transporting layer 208 comprises BPhen, and a constitutional formula of BPhen is

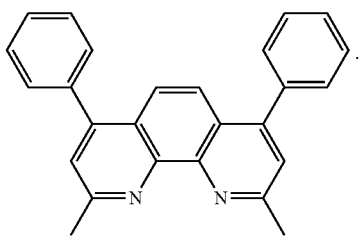 [SMILES: Cc1cc(-c2ccccc2)c2ccc3c(-c4ccccc4)cc(C)nc3c2n1]

Specifically, thicknesses of the first transparent conductive metal oxide layer 201 and the second transparent conductive metal oxide layer 204 are 10 nm-200 nm, and preferably are 10 nm-100 nm, and more preferably are 10 nm-50 nm.

Specifically, a thickness of the metal layer 202 is 80 nm-300 nm, and preferably is 80 nm-200 nm, and more preferably is 100 nm-150 nm.

Specifically, a thickness of the hole injection layer 205 is 5 nm-30 nm, and preferably is 5 nm-20 nm, and more preferably is 5 nm-10 nm.

Specifically, a thickness of the hole transporting layer 206 is 20 nm-400 nm, and preferably is 50 nm-300 nm, and more preferably is 50 nm-200 nm.

Specifically, a thickness of the red light emitting layer 217 is 10 nm-30 nm, and preferably is 15 nm-25 nm, and more preferably is 20 nm-25 nm.

Specifically, a thickness of the green light emitting layer 227 is 10 nm-50 nm, and preferably is 20 nm-40 nm, and more preferably is 30 nm-40 nm.

Specifically, a thickness of the green light emitting layer 237 is 10 nm-50 nm, and preferably is 20 nm-40 nm, and more preferably is 30 nm-40 nm.

Specifically, a thickness of the electron transporting layer 208 is 5 nm-50 nm, and preferably is 20 nm-40 nm, and more preferably is 25 nm-35 nm.

In the aforesaid OLED display device, by respectively configuring the first transparent semiconductor layer 213, the second transparent semiconductor layer 223, the third transparent semiconductor layer 233 in the red OLED elements 210, the green OLED elements 220 and the blue OLED elements 230, and setting the first transparent semiconductor layer 213, the second transparent semiconductor layer 223, the third transparent semiconductor layer 233 to have various thicknesses to realize that the luminous efficiencies of the red OLED elements 210, the green OLED elements 220 and the blue OLED elements 230 respectively achieve the best, and all the first transparent semiconductor layer 213, the second transparent semiconductor layer 223, the third transparent semiconductor layer 233 can be deposited and formed by plasma enhanced chemical vapor deposition and three masks. In comparison with the traditional OLED display device, the thicknesses of the hole transporting layers 206 in the red OLED elements 210, the green OLED elements 220 and the blue OLED elements 230 are the same in the OLED display device of the present invention, thus the hole transporting layers 206 in the red OLED elements 210, the green OLED elements 220 and the blue OLED elements 230 can be formed in the same evaporation process with one common metal mask (CMM) to eliminate three fine metal masks (FMM) in the process of the organic function layer. Although the process of the anode layer is relatively more complicated than prior art, the skill utilizing the FMM to deposit the inorganic film is relatively more mature than the skill of depositing the organic film and has the higher yield. Therefore, in sum, the technical solution of the present invention still has the obvious process advantage, and promotes the product yield while saving the cost.

Figure 2:
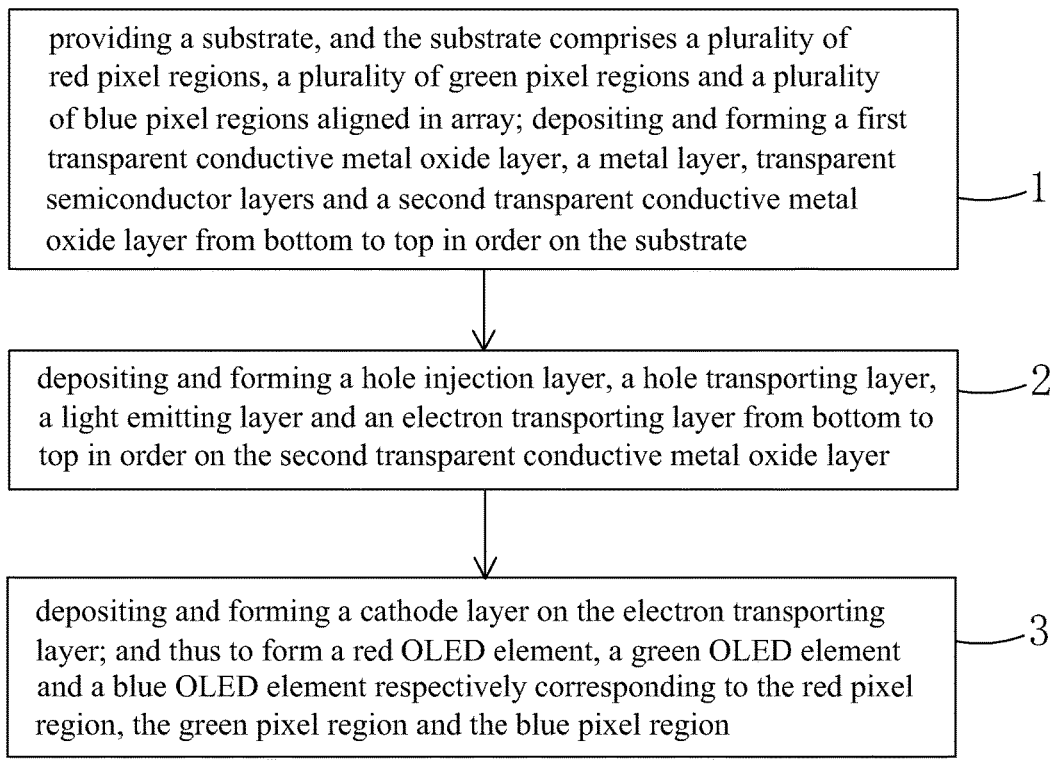
FIG. 2 is a flowchart of a manufacture method of an OLED display device of the present invention.

Please refer to FIG. 2 with FIG. 1, together. The present invention further provides a manufacture method of an OLED display device, comprising steps of:

step 1, forming an anode layer: providing a substrate 100, and forming a pixel definition layer 300 on the substrate 100, and configuring a plurality of through holes 310 which are separately located in the definition layer 300, and the plurality of through holes 310 defining a plurality of red pixel regions 110, a plurality of green pixel regions 120 and a plurality of blue pixel regions 130 on the substrate 100;

depositing and forming a first transparent conductive metal oxide layer 201 and a metal layer 202 from bottom to top in order on the substrate 100 corresponding to all the red pixel region 110, the green pixel region 120 and the blue pixel region 130;

employing plasma enhanced chemical vapor deposition and using three masks to respectively deposit and form transparent semiconductor layers 203 on the metal layer 202 corresponding to the red pixel region 110, the green pixel region 120 and the blue pixel region 130, and the transparent semiconductor layers 203 corresponding to the red pixel region 110, the green pixel region 120 and the blue pixel region 130 respectively being a first transparent semiconductor layer 213, a second transparent semiconductor layer 223 and a third transparent semiconductor layer 233;

forming a second transparent conductive metal oxide layer 204 on the transparent semiconductor layer 203 corresponding to the red pixel region 110, the green pixel region 120 and the blue pixel region 130. Specifically, the plurality of through holes 310 in the pixel definition layer 300 appear to be tapered, and a dimension of the through hole 310 gradually increases from one end away from the substrate 100 to one end close to the substrate 100.

Specifically, corresponding to each of the red pixel region 110, the green pixel region 120 and the blue pixel region 130, the first transparent conductive metal oxide layer 201, the metal layer 202, the transparent semiconductor layers 203 and the second transparent conductive metal oxide 204 which are stacked up from bottom to top in order constituting an anode layer 250, together;

Specifically, in step 1, a magnetron sputtering method is used to deposit the first transparent conductive metal oxide layer 201 and the second transparent conductive metal oxide layer 204 in the $1 \times 10^{-5}$ Pa vacuum, and the deposition rate is 60 nm/min.

Specifically, in step 1, a magnetron sputtering method is used to deposit the metal layer 202 in the $1 \times 10^{-5}$ Pa vacuum, and the deposition rate is 2400 nm/min.

Because the plurality of through holes 310 in the pixel definition layer 300 appear to be tapered, and a dimension of the through hole 310 gradually increases from one end away from the substrate 100 to one end close to the substrate 100. Thus, it can be ensured that as a magnetron sputtering method is used to deposit the first transparent conductive metal oxide layer 201, the second transparent conductive metal oxide layer 204 and the metal layer 202, the hole walls of the plurality of through holes 310 will not be sputtered with the target material to prevent that the corresponding structure layers in the plurality of through holes 310 are connected via the hole walls of the through holes 310 and the top surface of the pixel definition layer 300.

Specifically, in step1, the PECVD apparatus of the AKT company is used to deposit and form the first transparent semiconductor layer 213, the second transparent semiconductor layer 223, the third transparent semiconductor layer 233.

step 2, forming an organic function layer: depositing and forming a hole injection layer 205 and a hole transporting layer 206 from bottom to top in order on the second transparent conductive metal oxide layer 204 corresponding to the red pixel region 110, the green pixel region 120 and the blue pixel region 130;

respectively depositing and forming a light emitting layer 207 on the hole transporting layer 206 corresponding to the red pixel region 110, the green pixel region 120 and the blue pixel region 130, and the light emitting layers 207 corresponding to the red pixel region 110, the green pixel region 120 and the blue pixel region 130 respectively being a red light emitting layer 217, a green light emitting layer 227 and a blue light emitting layer 237;

forming an electron transporting layer 208 on the light emitting layers 207 corresponding to the red pixel region 110, the green pixel region 120 and the blue pixel region 130.

Specifically, before implementing step 2, step 21, cleaning the anode layer 250 is required.

Specifically, in step 21, first, the substrate 100 carrying the anode layer 250 is treated with ultrasonic process in commercial cleaning agent (such as detergent) to be washed in deionized water, and to be ultrasonic degreased in a mixture solvent of acetone/ethanol (volume ratio 1/1), and baked in a clean environment until the water is completely removed. Then, it is cleaned with ultraviolet light and ozone, and is bombarded at the surface with low energy ion beam (plasma, such as argon, nitrogen) to obtain the anode layer 250 which is clean.

step 3, forming a cathode layer: depositing and forming a cathode layer 209 on the electron transporting layer 208 corresponding to the red pixel region 110, the green pixel region 120 and the blue pixel region 130 to obtain a red OLED element 210, a green OLED element 220 and a blue OLED element 230 respectively corresponding to the red pixel region 110, the green pixel region 120 and the blue pixel region 130.

Materials of the first transparent semiconductor layer 213, the second transparent semiconductor layer 223 and the third transparent semiconductor layer 233 are the same, and a refractive index thereof is ηP; a refractive index of the second transparent conductive metal oxide layer 204 is ηI; a refractive index of the hole injection layer 205 is ηJ; a refractive index of the hole transporting layer 206 is ηT; a peak wavelength of red light emitted by the red light emitting layer 217 is λR, and a peak wavelength of green light emitted by the green light emitting layer 227 is λG, and a peak wavelength of blue light emitted by the blue light emitting layer 237 is λB; thicknesses of the first transparent semiconductor layer 213, the second transparent semiconductor layer 223 and the third transparent semiconductor layer 233 respectively are defined to be dRP, dGP and dBP, and a thickness of the second transparent conductive metal oxide layer 204 is defined to be dI, and a thickness of the hole injection layer 205 is defined to be dJ, and a thickness of the hole transporting layer 206 is defined to be dT;

then, a relation of $d_{RP}$, $d_I$, $d_J$, $d_T$ satisfies a relationship (1):

$$\eta_P \times d_{RP} + \eta_I \times d_I + \eta_J \times d_J + \eta_T \times d_T = (2m_R+1)\lambda_R/4 \quad (1);$$

wherein $m_R$ is a natural number;

a relation of $d_{GP}$, $d_I$, $d_J$, $d_T$ satisfies a relationship (2):

$$\eta_P \times d_{GP} + \eta_I \times d_I + \eta_J \times d_J + \eta_T \times d_T = (2m_G+1)\lambda_G/4 \quad (2);$$

wherein $m_G$ is a natural number;

a relation of $d_{BP}$, $d_I$, $d_J$, $d_T$ satisfies a relationship (3):

$$\eta_P \times d_{BP} + \eta_I \times d_I + \eta_J \times d_J + \eta_T \times d_T = (2m_B+1)\lambda_B/4 \quad (3)$$

wherein $m_B$ is a natural number.

Specifically, in step 2, the hole injection layer 205 is manufactured by one evaporation process with one common metal mask (CMM);

the hole transporting layer 206 is manufactured by one evaporation process with one common metal mask (CMM);

the red light emitting layer 217, the green light emitting layer 227 and the blue light emitting layer 237 require to use three fine metal masks (FMM) and three evaporation processes for manufacture;

the electron transporting layer 208 is manufactured by one evaporation process with one common metal mask (CMM).

Specifically, in step 3, the cathode 209 is manufactured by one evaporation process with one common metal mask (CMM).

Specifically, the common metal mask (CMM) is merely a metal mask having openings, and openings correspond to the all the red pixel regions 110, the green regions 120, the blue regions 130 which require evaporation and the pixel definition layers 300 among all the red pixel regions 110, the green regions 120, the blue regions 130 on the substrate 100.

Because the plurality of through holes 310 in the pixel definition layer 300 appear to be tapered, and a dimension of the through hole 310 gradually increases from one end away from the substrate 100 to one end close to the substrate 100. Thus, it can be ensured that as the common metal mask (CMM) is used to evaporate the hole injection layer 205, the hole transporting layer 206, the electron transporting layer 208, and the cathode layer 209, the hole walls of the plurality of through holes 310 will not be evaporated with the target material to prevent that the corresponding structure layers in the plurality of through holes 310 are connected via the hole walls of the through holes 310 and the top surface of the pixel definition layer 300.

Specifically, in steps 2-3, all evaporation processes are conducted in a vacuum chamber of $1 \times 10^{-6}$ to $2 \times 10^{-4}$ Pa vacuum.

Specifically, the evaporation rate of the hole injection layer 205 is 0.05 nm/s.

Specifically, the evaporation rate of the hole transporting layer 206 is 0.1 nm/s.

Specifically, the red light emitting layer 217 is formed by the evaporation method of main material and doped dye dual sources co evaporation, wherein the evaporation rate of main material is 0.1 nm/s, and the evaporation rate of doped dye is 0.003 nm/s.

Specifically, the green light emitting layer 227 is formed by the evaporation method of main material and doped dye dual sources co evaporation, wherein the evaporation rate of main material is 0.1 nm/s, and the evaporation rate of doped dye is 0.01 nm/s.

Specifically, the blue light emitting layer 237 is formed by the evaporation method of main material and doped dye dual sources co evaporation, wherein the evaporation rate of main material is 0.1 nm/s, and the evaporation rate of doped dye is 0.005 nm/s.

Specifically, the evaporation rate of the electron transporting layer 208 is 0.1 nm/s.

Specifically, in the aforesaid manufacture method of the OLED display device, the selections of the specific materials and thickness ranges of the respective structure layers are described aforementioned, and the repeated description is omitted here.

Specifically, as the cathode 209 is a magnesium silver alloy layer, the manufacture method of the cathode 209 is: formed by the evaporation method of magnesium and silver dual sources co evaporation, wherein the evaporation rate of magnesium is 0.09 nm/s, and the evaporation rate of silver is 0.01 nm/s.

In the aforesaid manufacture method of the OLED display device, by respectively configuring the first transparent semiconductor layer 213, the second transparent semiconductor layer 223, the third transparent semiconductor layer 233 in the red OLED elements 210, the green OLED elements 220 and the blue OLED elements 230, and setting the first transparent semiconductor layer 213, the second transparent semiconductor layer 223, the third transparent semiconductor layer 233 to have various thicknesses to realize that the luminous efficiencies of the red OLED elements 210, the green OLED elements 220 and the blue OLED elements 230 respectively achieve the best, and all the first transparent semiconductor layer 213, the second transparent semiconductor layer 223, the third transparent semiconductor layer 233 can be deposited and formed by plasma enhanced chemical vapor deposition and three masks. In comparison with the traditional OLED display device, the thicknesses of the hole transporting layers 206 in the red OLED elements 210, the green OLED elements 220 and the blue OLED elements 230 are the same in the OLED display device of the present invention, thus the hole transporting layers 206 in the red OLED elements 210, the green OLED elements 220 and the blue OLED elements 230 can be formed in the same evaporation process with one common metal mask (CMM) to eliminate three fine metal masks (FMM) in the process of the organic function layer. Although the process of the anode layer is relatively more complicated than prior art, the skill utilizing the FMM to deposit the inorganic film is relatively more mature than the skill of depositing the organic film and has the higher yield. Therefore, in sum, the technical solution of the present invention still has the obvious process advantage, and promotes the product yield while saving the cost.

With the comparison for the embodiment 1 of the present invention and the comparison 1 according to prior art, the advantages of the OLED display device and manufacture method thereof of the present invention are analyzed:

Embodiment 1

In the OLED display device of embodiment 1:

the red OLED element 210 comprises a first transparent conductive metal oxide layer 201, a metal layer 202, transparent semiconductor layers 203, a second transparent conductive metal oxide layer 204, a hole injection layer 205, a hole transporting layer 206, a red light emitting layer 217, an electron transporting layer 208 and a cathode layer 209 on the substrate 100 from bottom to top in order; in the red OLED element 210, a material of the first transparent conductive metal oxide layer 201 is ITO and a thickness is 20 nm; a material of the metal layer 202 is Ag and a thickness is 150 nm; a material of the first transparent semiconductor layer 213 is $SiO_2$ and a thickness is $X_R$ nm; a material of the second transparent conductive metal oxide layer 204 is ITO and a thickness is 20 nm; a material of the hole injection layer 205 is HAT(CN)$_6$ and a thickness is 5 nm; a material of the hole transporting layer 206 is HTM081 and a thickness is 20 nm; the red light emitting layer 217 comprises a main material CBP and red phosphorescent dye Ir(DBQ)$_2$(acac), and a concentration of the red phosphorescent dye Ir(DBQ)$_2$(acac) is 3 wt %, and a thickness of the red light emitting layer 217 is 30 nm; a material of the electron transporting layer 208 is Bphen, and a thickness is 20 nm; the cathode layer 209 is a magnesium silver alloy layer, and a mass ratio of the magnesium and silver in the magnesium silver alloy layer is 9:1, and a thickness of the cathode layer 209 is 20 nm;

the green OLED element 220 comprises a first transparent conductive metal oxide layer 201, a metal layer 202, transparent semiconductor layers 203, a second transparent conductive metal oxide layer 204, a hole injection layer 205, a hole transporting layer 206, a green light emitting layer 227, an electron transporting layer 208 and a cathode layer 209 on the substrate 100 from bottom to top in order; in the green OLED element 220, a material of the first transparent conductive metal oxide layer 201 is ITO and a thickness is 20 nm; a material of the metal layer 202 is Ag and a thickness is 150 nm; a material of the second transparent semiconductor layer 223 is SiO$_2$ and a thickness is X$_G$ nm; a material of the second transparent conductive metal oxide layer 204 is ITO and a thickness is 20 nm; a material of the hole injection layer 205 is HAT(CN)$_6$ and a thickness is 5 nm; a material of the hole transporting layer 206 is HTM081 and a thickness is 20 nm; the green light emitting layer 227 comprises a main material CBP and green phosphorescent dye Ir(ppy)$_3$, and a concentration of the green phosphorescent dye Ir(ppy)$_3$ is 10 wt %, and a thickness of the green light emitting layer 227 is 30 nm; a material of the electron transporting layer 208 is Bphen, and a thickness is 20 nm; the cathode layer 209 is a magnesium silver alloy layer, and a mass ratio of the magnesium and silver in the magnesium silver alloy layer is 9:1, and a thickness of the cathode layer 209 is 20 nm;

the blue OLED element 230 comprises a first transparent conductive metal oxide layer 201, a metal layer 202, transparent semiconductor layers 203, a second transparent conductive metal oxide layer 204, a hole injection layer 205, a hole transporting layer 206, a blue light emitting layer 237, an electron transporting layer 208 and a cathode layer 209 on the substrate 100 from bottom to top in order; In the blue OLED element 230, a material of the first transparent conductive metal oxide layer 201 is ITO and a thickness is 20 nm; a material of the metal layer 202 is Ag and a thickness is 150 nm; a material of the third transparent semiconductor layer 233 is SiO2 and a thickness is X$_B$ nm; a material of the second transparent conductive metal oxide layer 204 is ITO and a thickness is 20 nm; a material of the hole injection layer 205 is HAT(CN)$_6$ and a thickness is 5 nm; a material of the hole transporting layer 206 is HTM081 and a thickness is 20 nm; the blue light emitting layer 237 comprises a main material CBP and blue fluorescent dye BUBD-1, and a concentration of the blue fluorescent dye BUBD-1 is 5 wt %, and a thickness of the blue light emitting layer 237 is 20 nm; a material of the electron transporting layer 208 is Bphen and a thickness is 20 nm; the cathode layer 209 is a magnesium silver alloy layer, and a mass ratio of the magnesium and silver in the magnesium silver alloy layer is 9:1, and a thickness of the cathode layer 209 is 20 nm;

for making the red light emitting layer 217, the green light emitting layer 227, the blue light emitting layer 237 respectively at the positions of antinodes to make that the luminous efficiencies of the red OLED element 210, the green OLED element 220, the blue OLED element 230 respectively achieve the best, in condition of m$_R$=m$_G$=m$_B$=3, the thicknesses of the first transparent semiconductor layer 213, the second transparent semiconductor layer 223, the third transparent semiconductor layer 233 are respectively calculated according to the aforesaid relationships (1), (2), (3):

$$X_R=(459-1.75\times25-1.9\times20)/1.5=252 \text{ nm};$$

$$X_G=(384-1.75\times25-1.9\times20)/1.5=202 \text{ nm};$$

$$X_B=(343-1.75\times25-1.9\times20)/1.5=174 \text{ nm}.$$

Embodiment 2

In the OLED display device of embodiment 2, a material used for the first transparent semiconductor layer 213, the second transparent semiconductor layer 223, the third transparent semiconductor layer 233 is TiO$_2$, and the thicknesses of the first transparent semiconductor layer 213, the second transparent semiconductor layer 223, the third transparent semiconductor layer 233 are different from embodiment 1. The rest film layer settings are the same as those of embodiment 1.

Thus, for making the luminous efficiencies of the red OLED elements 210, the green OLED elements 220 and the blue OLED elements 230 respectively achieve the best, the thicknesses of the first transparent semiconductor layer 213, the second transparent semiconductor layer 223, the third transparent semiconductor layer 233 are respectively calculated:

$$X_R=(459-1.75\times25-1.9\times20)/2.5=151 \text{ nm};$$

$$X_G=(384-1.75\times25-1.9\times20)/2.5=121 \text{ nm};$$

$$X_B=(343-1.75\times25-1.9\times20)/2.5=104 \text{ nm}.$$

Comparison 1

In the OLED display device of comparison 1, the first transparent semiconductor layer 213, the second transparent semiconductor layer 223, the third transparent semiconductor layer 233 are not configured in the red OLED elements 210, the green OLED elements 220 and the blue OLED elements 230, and thicknesses of the hole transporting layers 206 of the red OLED elements 210, the green OLED elements 220 and the blue OLED elements 230 are different, which respectively are Y$_R$, Y$_G$, Y$_B$. The rest film layer settings are the same as those of embodiment 1.

Thus, for making the luminous efficiencies of the red OLED elements 210, the green OLED elements 220 and the blue OLED elements 230 respectively achieve the best, the thicknesses of the hole transporting layers 206 of the red OLED elements 210, the green OLED elements 220 and the blue OLED elements 230 are respectively calculated:

$$Y_R=(459-1.75\times5-1.9\times20)/1.75=236 \text{ nm};$$

$$Y_G=(384-1.75\times5-1.9\times20)/1.75=193 \text{ nm};$$

$$Y_B=(343-1.75\times5-1.9\times20)/1.75=169 \text{ nm}.$$

Under the same voltage driving, and for showing the same image, the image brightness and the chroma data of the OLED display devices of embodiment 1, the embodiment 2 and comparison 1 are shown in Table 1 and Table 2:

TABLE 1 image brightness and chroma data of the OLED display device of embodiment 1

| Embodiment 1 | brightness cd/m$^2$ | chroma CIE-X | chroma CIE-Y |
|---|---|---|---|
| W image | 165 | 0.300 | 0.313 |
| R image | 59 | 0.660 | 0.330 |

TABLE 1-continued image brightness and chroma data of the OLED
display device of embodiment 1

| Embodiment 1 | brightness cd/m² | chroma CIE-X | chroma CIE-Y |
|---|---|---|---|
| G image | 158 | 0.237 | 0.711 |
| B image | 13 | 0.144 | 0.044 |

TABLE 2 image brightness and chroma data of the OLED
display device of embodiment 2

| Embodiment 2 | brightness cd/m² | chroma CIE-X | chroma CIE-Y |
|---|---|---|---|
| W image | 168 | 0.300 | 0.313 |
| R image | 62 | 0.660 | 0.330 |
| G image | 160 | 0.237 | 0.711 |
| B image | 15 | 0.144 | 0.044 |

TABLE 3 image brightness and chroma data of the OLED
display device of comparison 1

| Comparison 1 | brightness cd/m² | chroma CIE-X | chroma CIE-Y |
|---|---|---|---|
| W image | 160 | 0.300 | 0.313 |
| R image | 57 | 0.671 | 0.329 |
| G image | 156 | 0.236 | 0.705 |
| B image | 12 | 0.144 | 0.044 |

As shown from Table 1 to Table 3, the display properties of the OLED display devices of the embodiment 1, the embodiment 2 and the comparison 1 are basically the same, however:

In the embodiments 1-2, by setting the first transparent semiconductor layer 213, the second transparent semiconductor layer 223, the third transparent semiconductor layer 233 to have various thicknesses to realize that the luminous efficiencies of the red OLED elements 210, the green OLED elements 220 and the blue OLED elements 230 respectively achieve the best, and the first transparent semiconductor layer 213, the second transparent semiconductor layer 223 and the third transparent semiconductor layer 233 are deposited and formed by the PECVD method with three masks. The thicknesses of the hole transporting layers 206 of the red OLED element 210, the green OLED element 220, the blue OLED element 230 are the same, thus the hole transporting layers 206 of the red OLED element 210, the green OLED element 220, the blue OLED element 230 can be formed in the same evaporation process with one common metal mask (CMM) to eliminate three fine metal masks in the process of the organic function layer.

In comparison 1, by setting the hole transporting layers 206 of the red OLED element 210, the green OLED element 220, the blue OLED element 230 to have different thicknesses to realize that the luminous efficiencies of the red OLED elements 210, the green OLED elements 220 and the blue OLED elements 230 respectively achieve the best. The thicknesses of the hole transporting layers 206 of the red OLED element 210, the green OLED element 220, the blue OLED element 230 are different, thus the hole transporting layers 206 of the red OLED element 210, the green OLED element 220, the blue OLED element 230 require three different fine metal masks (FMM) to be manufactured with three evaporation processes.

Therefore, compared with comparison 1, the embodiments 1-2 of the present invention simplifies the evaporation process of the organic function layer. Although the process of the anode layer is relatively more complicated than prior art, and the first transparent semiconductor layer 213, the second transparent semiconductor layer 223 and the third transparent semiconductor layer 233 require three masks to be deposited and formed by the PECVD method, the skill utilizing the FMM to deposit the inorganic film is relatively more mature than the skill of depositing the organic film and has the higher yield. Therefore, in sum, the technical solution of the present invention still has the obvious process advantage, and tremendously promotes the product yield while saving the cost.

In conclusion, the present invention provides an OLED display device and a manufacture method thereof. By respectively configuring the first transparent semiconductor layer, the second transparent semiconductor layer and the third transparent semiconductor layer in the anode layers of the red OLED element, the green OLED element, the blue OLED element, and setting the first transparent semiconductor layer, the second transparent semiconductor layer and the third transparent semiconductor layer to have various thicknesses to realize that the luminous efficiencies of the red OLED element, the green OLED element, the blue OLED element respectively achieve the best, and all the first transparent semiconductor layer, the second transparent semiconductor layer and the third transparent semiconductor layer are deposited and formed by plasma enhanced chemical vapor deposition and three masks. In comparison with the traditional OLED display device, the thicknesses of the hole transporting layers in the red OLED element, the green OLED element, the blue OLED element are respectively set to be the same in the present invention, thus they can be formed in the same evaporation process with one common metal mask to save the three fine metal masks (FMM) in the organic function layer process. Although the process of the anode layer is relatively more complicated than prior art, the skill utilizing the FMM to deposit the inorganic film is relatively more mature than the skill of depositing the organic film and has the higher yield. Therefore, in sum, the technical solution of the present invention still has the obvious process advantage, and tremendously promotes the product yield while saving the cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. An OLED display device, comprising a substrate, and a plurality of red OLED elements, a plurality of green OLED elements and a plurality of blue OLED elements aligned on the substrate in array;

either of the red OLED element, the green OLED element and the blue OLED element comprising a first transparent conductive metal oxide layer, a metal layer, transparent semiconductor layers, a second transparent conductive metal oxide layer, a hole injection layer, a hole transporting layer, light emitting layers, an electron transporting layer and a cathode layer on the substrate from bottom to top in order;

the transparent semiconductor layers of the red OLED element, the green OLED element and the blue OLED element respectively being a first transparent semiconductor layer, a second transparent semiconductor layer and a third transparent semiconductor layer;

the light emitting layers of the red OLED element, the green OLED element and the blue OLED element respectively being a red light emitting layer, a green light emitting layer and a blue light emitting layer;

wherein materials of the first transparent semiconductor layer, the second transparent semiconductor layer and the third transparent semiconductor layer are the same, and a refractive index thereof is $\eta_P$; a refractive index of the second transparent conductive metal oxide layer is $\eta_I$; a refractive index of the hole injection layer is $\eta_J$; a refractive index of the hole transporting layer is $\eta_T$; a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$; thicknesses of the first transparent semiconductor layer, the second transparent semiconductor layer and the third transparent semiconductor layer respectively are defined to be $d_{RP}$, $d_{GP}$ and $d_{BP}$, and a thickness of the second transparent conductive metal oxide layer is defined to be $d_I$, and a thickness of the hole injection layer is defined to be $d_J$, and a thickness of the hole transporting layer is defined to be $d_T$; then a relation of $d_{RP}$, $d_I$, $d_J$, $d_T$ satisfies a relationship:

$$\eta_P \times d_{RP} + \eta_I \times d_I + \eta_J \times d_J + \eta_T \times d_T = (2m_R+1)\lambda_R/4;$$

wherein $m_R$ is a natural number;
a relation of $d_{GP}$, $d_I$, $d_J$, $d_T$ satisfies a relationship:

$$\eta_P \times d_{GP} + \eta_I \times d_I + \eta_J \times d_J + \eta_T \times d_T = (2m_G+1)\lambda_G/4;$$

wherein $m_G$ is a natural number;
a relation of $d_{BP}$, $d_I$, $d_J$, $d_T$ satisfies a relationship:

$$\eta_P \times d_{BP} + \eta_I \times d_I + \eta_J \times d_J + \eta_T \times d_T = (2m_B+1)\lambda_B/4;$$

wherein $m_B$ is a natural number.

2. The OLED display device according to claim 1, wherein all materials of the first transparent semiconductor layer, the second transparent semiconductor layer and the third transparent semiconductor layer are $SiO_2$, $TiO_2$, MgO, ZnO, $Al_2O_3$, $SnO_2$, $InO_2$, $ZrO_2$, $SiN_x$, $Si_3N_4$, $MgF_2$, $CaF_2$, ZnSe or ZnS, wherein X>1;

light transmittances of the first transparent semiconductor layer, the second transparent semiconductor layer and the third transparent semiconductor layer are larger than 80%; all refractive indexes of the first transparent semiconductor layer, the second transparent semiconductor layer and the third transparent semiconductor layer are between 1.0-3.5.

3. The OLED display device according to claim 1, wherein a material of the first transparent conductive metal oxide layer and the second transparent conductive metal oxide layer is indium tin oxide; a material of the metal layer is silver.

4. The OLED display device according to claim 1, wherein all the red light emitting layer, the green light emitting layer and the blue light emitting layer comprise a main material and a doped dye;

the main material of the red light emitting layer is CBP, and the doped dye is red phosphorescent dye, and the red phosphorescent dye is $Ir(DBQ)_2(acac)$;

the main material of the green light emitting layer is CBP, and the doped dye is green phosphorescent dye, and the green phosphorescent dye is $Ir(ppy)_3$;

the main material of the blue light emitting layer is AND, and the doped dye is blue fluorescent dye, and the blue fluorescent dye is BUBD-1;

a material of the hole injection layer comprises $HAT(CN)_6$;

a material of the electron transporting layer comprises BPhen.

5. The OLED display device according to claim 1, wherein a material of the cathode layer comprises at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium.

6. A manufacture method of an OLED display device, comprising steps of:

step 1, providing a substrate, and the substrate comprises a plurality of red pixel regions, a plurality of green pixel regions and a plurality of blue pixel regions aligned in array;

depositing and forming a first transparent conductive metal oxide layer and a metal layer from bottom to top in order on the substrate corresponding to all the red pixel region, the green pixel region and the blue pixel region;

employing plasma enhanced chemical vapor deposition and using three masks to respectively deposit and form transparent semiconductor layers on the metal layer corresponding to the red pixel region, the green pixel region and the blue pixel region, and the transparent semiconductor layers corresponding to the red pixel region, the green pixel region and the blue pixel region respectively being a first transparent semiconductor layer, a second transparent semiconductor layer and a third transparent semiconductor layer;

forming a second transparent conductive metal oxide layer on the transparent semiconductor layer corresponding to the red pixel region, the green pixel region and the blue pixel region;

step 2, depositing and forming a hole injection layer and a hole transporting layer from bottom to top in order on the second transparent conductive metal oxide layer corresponding to the red pixel region, the green pixel region and the blue pixel region;

respectively depositing and forming light emitting layers on the hole transporting layer corresponding to the red pixel region, the green pixel region and the blue pixel region, and the light emitting layers corresponding to the red pixel region, the green pixel region and the blue pixel region respectively being a red light emitting layer, a green light emitting layer and a blue light emitting layer;

forming an electron transporting layer on the light emitting layers corresponding to the red pixel region, the green pixel region and the blue pixel region;

step 3, depositing and forming a cathode layer on the electron transporting layer corresponding to the red pixel region, the green pixel region and the blue pixel region to obtain a red OLED element, a green OLED element and a blue OLED element respectively corresponding to the red pixel region, the green pixel region and the blue pixel region;

wherein materials of the first transparent semiconductor layer, the second transparent semiconductor layer and the third transparent semiconductor layer are the same, and a refractive index thereof is $\eta_P$; a refractive index of the second transparent conductive metal oxide layer is $\eta_I$; a refractive index of the hole injection layer is $\eta_J$; a refractive index of the hole transporting layer is $\eta_T$; a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$; thicknesses of the first transparent semiconductor layer, the second transparent semiconductor layer and the third transparent semiconductor layer respectively are defined to be $d_{RP}$, $d_{GP}$ and $d_{BP}$, and a thickness of the second transparent conductive metal oxide layer is defined to be $d_I$, and a thickness of the hole injection layer is defined to be $d_J$, and a thickness of the hole transporting layer is defined to be $d_T$; then a relation of $d_{RP}$, $d_I$, $d_J$, $d_T$ satisfies a relationship:

$$\eta_P \times d_{RP} + \eta_I \times d_I + \eta_J \times d_J + \eta_T \times d_T = (2m_R+1)\lambda_R/4;$$

wherein $m_R$ is a natural number;
a relation of $d_{GP}$, $d_I$, $d_J$, $d_T$ satisfies a relationship:

$$\eta_P \times d_{GP} + \eta_I \times d_I + \eta_J \times d_J + \eta_T \times d_T = (2m_G+1)\lambda_G/4;$$

wherein $m_G$ is a natural number;
a relation of $d_{BP}$, $d_I$, $d_J$, $d_T$ satisfies a relationship:

$$\eta_P \times d_{BP} + \eta_I \times d_I + \eta_J \times d_J + \eta_T \times d_T = (2m_B+1)\lambda_B/4;$$

wherein $m_B$ is a natural number.

7. The manufacture method of the OLED display device according to claim 6, wherein all materials of the first transparent semiconductor layer, the second transparent semiconductor layer and the third transparent semiconductor layer are $SiO_2$, $TiO_2$, MgO, ZnO, $Al_2O_3$, $SnO_2$, $InO_2$, $ZrO_2$, $SiN_x$, $Si_3N_4$, $MgF_2$, $CaF_2$, ZnSe or ZnS, wherein X>1;
light transmittances of the first transparent semiconductor layer, the second transparent semiconductor layer and the third transparent semiconductor layer are larger than 80%; all refractive indexes of the first transparent semiconductor layer, the second transparent semiconductor layer and the third transparent semiconductor layer are between 1.0-3.5.

8. The manufacture method of the OLED display device according to claim 6, wherein a material of the first transparent conductive metal oxide layer and the second transparent conductive metal oxide layer is indium tin oxide; a material of the metal layer is silver;
in step 1, a magnetron sputtering method is used to deposit and form the first transparent conductive metal oxide layer, the second transparent conductive metal oxide layer and the metal layer.

9. The manufacture method of the OLED display device according to claim 6, wherein all the red light emitting layer, the green light emitting layer and the blue light emitting layer comprise a main material and a doped dye;
the main material of the red light emitting layer is CBP, and the doped dye is red phosphorescent dye, and the red phosphorescent dye is $Ir(DBQ)_2(acac)$;
the main material of the green light emitting layer is CBP, and the doped dye is green phosphorescent dye, and the green phosphorescent dye is $Ir(ppy)_3$;
the main material of the blue light emitting layer is AND, and the doped dye is blue fluorescent dye, and the blue fluorescent dye is BUBD-1;
a material of the hole injection layer comprises $HAT(CN)_6$;
a material of the electron transporting layer comprises BPhen;

in step 2, a vacuum evaporation method is used to deposit and form the hole injection layer, the hole transporting layer and the electron transporting layer.

10. The manufacture method of the OLED display device according to claim 6, wherein a material of the cathode layer comprises at least one of low work function metal, alloy formed by low work function metal and at least one of copper, gold, and silver, low work function metal nitride and low work unction metal fluoride; the low work function metal comprises at least one of lithium, magnesium, calcium, strontium, aluminum and indium;
in step 3, a vacuum evaporation method is used to deposit and form the cathode layer.

11. An OLED display device, comprising a substrate, and a plurality of red OLED elements, a plurality of green OLED elements and a plurality of blue OLED elements aligned on the substrate in array;
either of the red OLED element, the green OLED element and the blue OLED element comprising a first transparent conductive metal oxide layer, a metal layer, transparent semiconductor layers, a second transparent conductive metal oxide layer, a hole injection layer, a hole transporting layer, light emitting layers, an electron transporting layer and a cathode layer on the substrate from bottom to top in order;
the transparent semiconductor layers of the red OLED element, the green OLED element and the blue OLED element respectively being a first transparent semiconductor layer, a second transparent semiconductor layer and a third transparent semiconductor layer;
the light emitting layers of the red OLED element, the green OLED element and the blue OLED element respectively being a red light emitting layer, a green light emitting layer and a blue light emitting layer;
wherein materials of the first transparent semiconductor layer, the second transparent semiconductor layer and the third transparent semiconductor layer are the same, and a refractive index thereof is $\eta_P$; a refractive index of the second transparent conductive metal oxide layer is $\eta_I$; a refractive index of the hole injection layer is $\eta_J$; a refractive index of the hole transporting layer is $\eta_T$; a peak wavelength of red light emitted by the red light emitting layer is $\lambda_R$, and a peak wavelength of green light emitted by the green light emitting layer is $\lambda_G$, and a peak wavelength of blue light emitted by the blue light emitting layer is $\lambda_B$; thicknesses of the first transparent semiconductor layer, the second transparent semiconductor layer and the third transparent semiconductor layer respectively are defined to be $d_{RP}$, $d_{GP}$ and $d_{BP}$, and a thickness of the second transparent conductive metal oxide layer is defined to be $d_I$, and a thickness of the hole injection layer is defined to be $d_J$, and a thickness of the hole transporting layer is defined to be $d_T$; then a relation of $d_{RP}$, $d_I$, $d_J$, $d_T$ satisfies a relationship:

$$\eta_P \times d_{RP} + \eta_I \times d_I + \eta_J \times d_J + \eta_T \times d_T = (2m_R+1)\lambda_R/4;$$

wherein $m_R$ is a natural number;
a relation of $d_{GP}$, $d_I$, $d_J$, $d_T$ satisfies a relationship:

$$\eta_P \times d_{GP} + \eta_I \times d_I + \eta_J \times d_J + \eta_T \times d_T = (2m_G+1)\lambda_G/4;$$

wherein $m_G$ is a natural number;
a relation of $d_{BP}$, $d_I$, $d_J$, $d_T$ satisfies a relationship:

$$\eta_P \times d_{BP} + \eta_I \times d_I + \eta_J \times d_J + \eta_T \times d_T = (2m_B+1)\lambda_B/4;$$

wherein $m_B$ is a natural number;

wherein all materials of the first transparent semiconductor layer, the second transparent semiconductor layer and the third transparent semiconductor layer are $SiO_2$, $TiO_2$, MgO, ZnO, $Al_2O_3$, $SnO_2$, $InO_2$, $ZrO_2$, $SiN_x$, $Si_3N_4$, $MgF_2$, $CaF_2$, ZnSe or ZnS, wherein X>1;

light transmittances of the first transparent semiconductor layer, the second transparent semiconductor layer and the third transparent semiconductor layer are larger than 80%; all refractive indexes of the first transparent semiconductor layer, the second transparent semiconductor layer and the third transparent semiconductor layer are between 1.0-3.5;

wherein a material of the first transparent conductive metal oxide layer and the second transparent conductive metal oxide layer is indium tin oxide; a material of the metal layer is silver.

12. The OLED display device according to claim 11, wherein all the red light emitting layer, the green light emitting layer and the blue light emitting layer comprise a main material and a doped dye;

the main material of the red light emitting layer is CBP, and the doped dye is red phosphorescent dye, and the red phosphorescent dye is $Ir(DBQ)_2(acac)$;

the main material of the green light emitting layer is CBP, and the doped dye is green phosphorescent dye, and the green phosphorescent dye is $Ir(ppy)_3$;

the main material of the blue light emitting layer is AND, and the doped dye is blue fluorescent dye, and the blue fluorescent dye is BUBD-1;

a material of the hole injection layer comprises $HAT(CN)_6$;

a material of the electron transporting layer comprises BPhen.

13. The OLED display device according to claim 11, wherein a material of the cathode layer comprises at least one of low work function metal, alloy formed by low work function metal and at least one of copper, gold, and silver, low work function metal nitride and low work function metal fluoride; the low work function metal comprises at least one of lithium, magnesium, calcium, strontium, aluminum and indium.

\* \* \* \* \*